(12) United States Patent
Gunnarsson et al.

(10) Patent No.: US 9,964,446 B2
(45) Date of Patent: May 8, 2018

(54) BOLOMETER

(71) Applicant: The University of Warwick, Warwickshire (GB)

(72) Inventors: David Gunnarsson, Espoo (FI); Evan Parker, Warwickshire (GB); Martin Prest, Warwickshire (GB); Mika Prunnila, Espoo (FI); Terence Whall, Warwickshire (GB)

(73) Assignee: The University of Warwick, Warwickshire (GB)

( * ) Notice: Subject to any disclaimer, the term of this patent is extended or adjusted under 35 U.S.C. 154(b) by 142 days.

(21) Appl. No.: 15/035,182

(22) PCT Filed: Nov. 4, 2014

(86) PCT No.: PCT/GB2014/053274
§ 371 (c)(1),
(2) Date: May 6, 2016

(87) PCT Pub. No.: WO2015/067932
PCT Pub. Date: May 14, 2015

(65) Prior Publication Data
US 2016/0290868 A1  Oct. 6, 2016

(30) Foreign Application Priority Data

Nov. 6, 2013 (GB) .................................. 1319617.5

(51) Int. Cl.
*G01J 5/20* (2006.01)
*G01J 5/04* (2006.01)
(Continued)

(52) U.S. Cl.
CPC ............... *G01J 5/046* (2013.01); *G01J 5/024* (2013.01); *G01J 5/20* (2013.01); *H01L 31/09* (2013.01);
(Continued)

(58) Field of Classification Search
CPC ......... G01J 5/20; G01J 5/08; H01L 27/14649; H01L 31/09; H04N 5/33
See application file for complete search history.

(56) References Cited

U.S. PATENT DOCUMENTS 4,220,959 A * 9/1980 Kroger ................. H01L 39/223
257/32
4,970,395 A 11/1990 Kruse

FOREIGN PATENT DOCUMENTS

JP          H11 4014 A      1/1999

OTHER PUBLICATIONS

Devyatov et al. "Theoretical analysis of the new microwave detector based on Josephson heterostructure," Proc. SPIE 7521, International Conference on Micro- and Nano-Electronics 2009, p. 1-13.*
(Continued)

*Primary Examiner* — David Porta
*Assistant Examiner* — Mamadou Faye
(74) *Attorney, Agent, or Firm* — NovoTechIP International PLLC (57) ABSTRACT

A bolometer is described. A bolometer includes a superconductor-insulator-semiconductor-superconductor structure or a superconductor-insulator-semiconductor-insulator-superconductor structure. The semiconductor comprises an electron gas in a layer of silicon, germanium or silicon-germanium alloy in which valley degeneracy is at least partially lifted. The insulator or a one or both of the insulators may comprise a layer of dielectric material. The insulator or a one or both of the insulators may comprise a layer of non-degenerately doped semiconductor.

24 Claims, 11 Drawing Sheets (51) Int. Cl.
  *H01L 39/22*   (2006.01)
  *H01L 39/24*   (2006.01)
  *G01J 5/02*    (2006.01)
  *H01L 31/09*   (2006.01)
  *G01J 5/10*    (2006.01)

(52) U.S. Cl.
  CPC .............. *H01L 39/22* (2013.01); *H01L 39/24* (2013.01); *G01J 2005/106* (2013.01); *G01J 2005/208* (2013.01)

(56) References Cited

OTHER PUBLICATIONS

A.M. Savin et al., "Efficient electronic cooling in heavily doped silicon by quasiparticle tunneling," Applied Physics Letters, American Institute of Physics, U.S., vol. 79, No. 10, Sep. 3, 2001, pp. 1471-1473.

D. Morozov et al., "High sensitivity terahertz detector using two-dimensional electron gas absorber and tunnel junction contacts as a thermometer," Millimeter and Submillimeter Detectors and Instrumentation for Astronomy III, Proc. of SPIE, vol. 6275, 2006.

* cited by examiner

BOLOMETER

CROSS-REFERENCE TO RELATED APPLICATIONS

This application is a National Stage of International patent application PCT/GB2014/053274, filed on Nov. 4, 2014, which claims priority to foreign patent application No. GB 1319617.5, filed on Nov. 6, 2013, the disclosures of which are each incorporated by reference in their entireties.

FIELD OF THE INVENTION

The present invention relates to a bolometer and to apparatus comprising an array of bolometers.

BACKGROUND

A bolometer can be used to detect and measure energy (or power) of incident electromagnetic radiation.

Superconductor-based bolometers can exhibit high sensitivity and fast response.

One form of superconductor-based bolometer is a hot-electron bolometer (HEB) which comprises a superconductor and a pair of normal metal contacts. An example of a hot-electron bolometer is described in JP 2004 88852 A.

Another form of superconductor-based bolometer is a cold-electron bolometer (CEB) which comprises a normal metal-insulator-superconductor (NIS) tunnel junction, for example, as described in U.S. Pat. No. 5,634,718 A. The metal region serves as an absorber which is cooled using the tunnel junction.

Yet another form of superconductor-based bolometer is a transition-edge sensor (TES) which is similar to the cold-electron bolometer but which employs direct dc heating. An example of a transition-edge sensor is described in US 2010 304977 A1.

Although existing forms of bolometers which employ a normal metal and a superconductor exhibit high sensitivity and fast response, there is scope for improving performance.

SUMMARY

According to a first aspect of the present invention there is provided a bolometer. The bolometer comprises a superconductor-insulator-semiconductor-superconductor structure or a superconductor-insulator-semiconductor-insulator-superconductor structure. The semiconductor comprises an electron gas in a layer of silicon, germanium or silicon-germanium alloy in which valley degeneracy is at least partially lifted.

Using an electron gas in silicon, germanium or silicon-germanium alloy as the sensing to element can help not only to reduce thermal coupling to the sensing element, but also to decrease the thermal capacity of the sensing element. This can help to enhance sensitivity and responsivity.

An insulator may comprise a layer of dielectric material. Additionally or alternatively, an insulator may comprise a layer of non-degenerately doped semiconductor.

In a superconductor-insulator-semiconductor-insulator-superconductor structure, the insulators may be of the same type, for example, each comprising a respective layer of dielectric material and/or a respective layer of non-degenerately doped semiconductor. At least part of the insulator may comprise common layer(s).

Using a dielectric layer can help to reduce sub-gap leakage which can improve the sensitivity and cooling power of the junction(s).

The layer of silicon, germanium or silicon-germanium may be strained. Thus, valley degeneracy can be at least partially lifted using strain. The layer may be strained by virtue of being formed on a layer of another, different semiconductor, i.e. with a different lattice constant and/or crystal structure. For example, a layer of silicon may be formed on a layer of strain-relaxed silicon-germanium alloy. Strain may be introduced using local strain (or "process-induced" strain). Valley degeneracy may be lifted by confinement of the electron gas. Confinement may occur in a two-dimensional electron gas.

The layer of silicon, germanium or silicon-germanium alloy may comprise a layer of n-type silicon, germanium or silicon-germanium alloy. For example, the layer may be doped with phosphorus (P), arsenic (As) or antinomy (Sb).

The layer of silicon, germanium or silicon-germanium may be doped to a concentration of at least $1\times10^{18}$ cm$^{-3}$ or at least $1\times10^{19}$ cm$^{-3}$, that is, such that the layer is degenerately doped. The layer may be doped to a concentration of at least $1\times10^{20}$ cm$^{-3}$. The layer may be doped to a concentration of up to $1\times10^{21}$ cm$^{-3}$ or more. The layer may have a thickness no more than 5 nm, no more than 4 nm or no more than 3 nm. Thus, the electron gas may be a two-dimensional electron gas. However, the layer may be thicker, for example, having a thickness of at least 10 nm or at least 20 nm and may have a thickness up to 50 nm or up to 100 nm or more.

The layer may include a delta-doped layer. The delta-doped layer may be an n-type delta-doped layer, for example doped with phosphorus (P) arsenic (As) or antinomy (Sb). The delta-doped layer may have an areal doping concentration of at least $1\times10^{12}$ cm$^{-2}$, at least $5\times10^{12}$ cm$^{-2}$, at least $1\times10^{13}$ cm$^{-2}$ or at least $2\times10^{13}$ cm$^{-2}$. The delta-doped layer may have a thickness (full width at half maximum) of no more than 3 nm.

The layer of silicon, germanium or silicon-germanium may be undoped. The layer of silicon, germanium or silicon-germanium may be disposed in a structure, for example a heterostructure, which includes a doped layer of semiconductor. Thus, the electron gas may arise as a result of modulation doping. The bolometer may include a gate electrode and a gate dielectric disposed between the gate electrode and the semiconductor arranged to apply an electric field so as to form the electron gas.

The silicon, germanium or silicon-germanium layer may include a quantum well.

The layer may have an area (i.e. in plan view) of less than 1 µm$^2$. The layer may have an area of no more than 1 µm$^2$ or no more than 0.01 µm$^2$. However, the layer may have an area of up to 100 µm$^2$ or up to 1000 µm$^2$ or more.

The bolometer may include a substrate. The substrate may take the form of a wafer or wafer die of single crystal silicon or single crystal germanium. The bolometer may include one or more buffer layers. The buffer layer(s) may include a graded silicon-germanium layer. The buffer layer(s) may include a silicon-germanium layer. The silicon-germanium layer may be strain relaxed.

The insulator may be or include a region of depleted semiconductor. The insulator may be or include a region of low-doped semiconductor which, at temperature of operation of the bolometer, is an insulator.

The insulator may comprise a product of a chemical process or deposited material. The dielectric material may comprise or predominantly be an oxide. The dielectric material may comprise or predominantly be a nitride. The dielectric material may comprise or predominantly be an oxynitride.

The dielectric material may comprise or predominantly be an oxide of the semiconductor. Thus, the dielectric material may comprise or predominantly be silicon dioxide or germanium oxide or germanium dioxide.

The dielectric material may comprise or predominantly be an oxide of the superconductor.

The dielectric material may comprise a mixture of an oxide, nitride, oxynitride or compound of the semiconductor and an oxide, nitride, oxynitride or compound of the superconductor.

The dielectric layer may have a thickness no more than 5 nm, no more than 3 nm or no more than 2 nm.

The superconductor may be an elemental superconductor, such as aluminium (Al), tin (Sn), niobium (Nb), vanadium (V) or tantalum (Ta).

According to a second aspect of the present invention there is provided apparatus comprising a bolometer and circuitry arranged to measure the bolometer comprising a voltage and/or current bias source and a sensor for measuring for current through the bolometer and/or for measuring a voltage across the bolometer.

The system may include a system configured to cool the bolometer to a temperature no more than 100 K. The system may include a cryogenic system configured to cool the bolometer to a temperature no more than 4.2 K.

The circuitry may be arranged for single photon measurement and/or integrating measurement.

According to a third aspect of the present invention there is provided apparatus comprising an array of bolometers supported on a common substrate.

The system may include a system configured to cool the bolometer to a temperature no more than 100 K. The system may include a cryogenic system configured to cool the array of bolometers to a temperature no more than 4.2 K.

The circuitry may be arranged for single photon measurement and/or integrating measurement.

According to a fourth aspect of the present invention there is provided an astronomical detection system (i.e. an imaging system for use in astronomy) comprising the bolometer or the apparatus.

According to a fifth aspect of the present invention there is provided a biomedical imaging system comprising the bolometer or the apparatus.

According to a sixth aspect of the present invention there is provided a security screening system (for example for use in airport for imaging passengers and/or luggage) comprising the bolometer or the apparatus.

According to a seventh aspect of the present invention there is provided a remote sensing system (for example, for aerial imaging of terrain) comprising the bolometer or the apparatus.

According to an eighth aspect of the present invention there is provided a quantum information processing system comprising the bolometer or the apparatus.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

Figure 1:
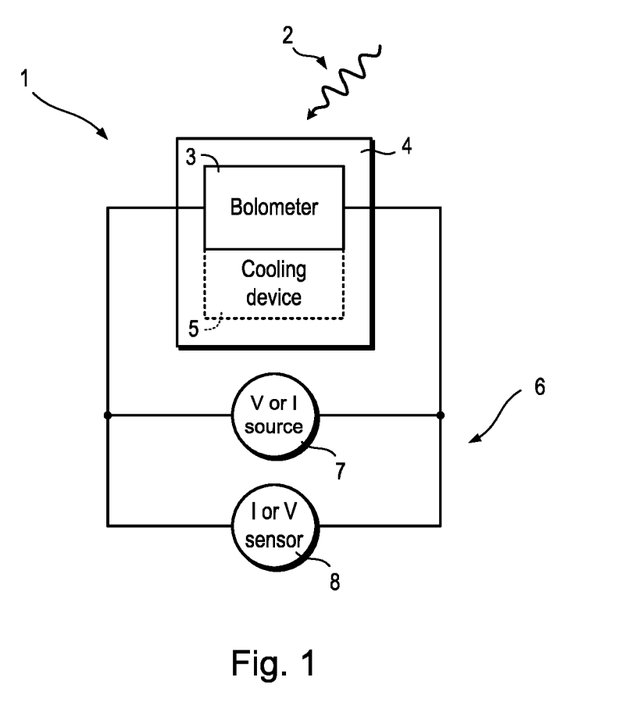
FIG. 1 is schematic block diagram of a detection system which includes a bolometer.

Referring to FIG. 1, a detection system 1 for measuring the energy (or power) of incident radiation in the form of one or more photons 2 in optical, infrared and/or terahertz regions of the electromagnetic spectrum is shown.

The system 1 includes a bolometer 3 (which may be an element in an array) which is cooled to cryogenic temperatures, preferably between 0.5 and 2 K, using a refrigeration system 4, such as a closed-cycle helium-4 system. The bolometer 3 may be provided with a cooling device 5 which may be integrated into the bolometer 3 or which is supported on the same substrate on which the bolometer 3 is formed.

Measurement of photon energy is performed using circuitry 6 which includes a current or voltage bias source 7 which may be a current bias source for driving a constant current through the bolometer 3 or a voltage bias source for applying a constant voltage bias across the bolometer 3, and a voltage or current sensor 8 which may be a voltmeter to measure a voltage across the bolometer 3 or a current meter to measure current flowing through the bolometer 3.

The bolometer 3 may operate in current bias or voltage bias modes.

In current bias mode, a current source 7 drives a constant current through the bolometer 3 and change(s) in voltage across the bolometer 3 is (are) measured using the voltmeter 8 following absorption of photon energy.

In voltage bias mode, a voltage source 7 applies a fixed voltage across the bolometer 3 and change(s) in the current flowing through the bolometer 3 is (are) measured arising from photon absorption.

Figure 2:
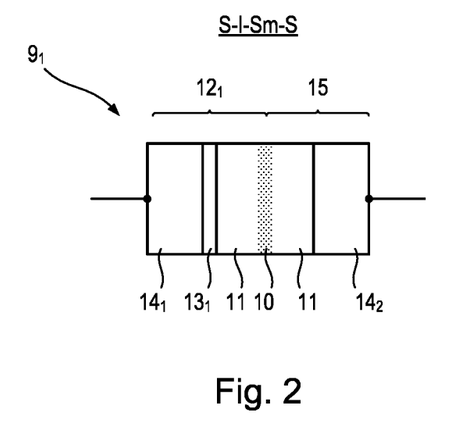
FIG. 2 is a schematic diagram of a superconductor-insulator-semiconductor-insulator-superconductor (S-I-Sm-I-S) structure.
Figure 3:
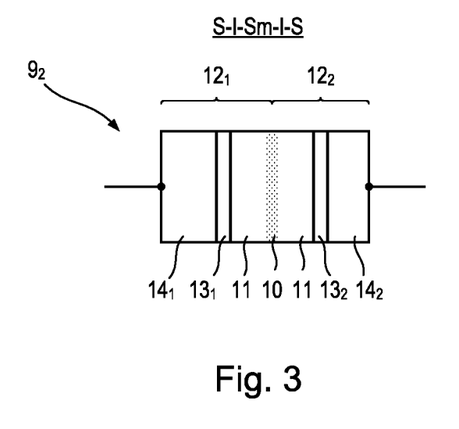
FIG. 3 is a schematic diagram of a superconductor-insulator-semiconductor-superconductor (S-I-Sm-S) structure.

Referring to FIGS. 2 and 3, the bolometer 3 can employ a superconductor-insulator-semiconductor-insulator-superconductor (S-I-Sm-S) structure $9_1$ or a superconductor-insulator-semiconductor-insulator-superconductor (S-I-Sm-I-S) structure $9_2$.

The structures $9_1$, $9_2$ include an electron gas 10 formed in a region (e.g. layer) of semiconductor 11 which is silicon, germanium or silicon-germanium alloy. Valley degeneracy in the semiconductor 11 is at least partially lifted using strain and/or quantum confinement.

Referring in particular to FIG. 2, the first structure $9_1$ includes a superconductor-insulator-semiconductor junction $12_1$ which includes a region of dielectric material $13_1$, which is in direct contact with the semiconductor 11, and a first superconductor contact $14_1$, which is in direct contact with the dielectric $13_1$. The structure $9_1$ includes a superconductor-semiconductor junction 15 which includes a second superconductor contact $14_2$, which is in direct contact with the semiconductor 11.

In the first structure $9_1$, any depletion region formed at the interface of the semiconductor 11 dielectric $13_1$ is sufficiently short and/or has a sufficiently low barrier height to be considered not to provide a region of insulator.

Referring also to FIG. 3, the second structure $9_2$ includes first and second superconductor-insulator-semiconductor junctions $12_1$, $12_2$. Each junction $12_1$, $12_2$ includes a respective region of dielectric material $13_1$, $13_2$ which is in direct contact with the semiconductor 11 and a respective superconductor contact $14_1$, $14_2$ which is in direct contact with the dielectric $13_1$, $13_2$ respectively.

One or both regions of dielectric material $13_1$, $13_2$ may be omitted. Thus, the insulator may be provided by a depleted region of semiconductor.

As will be explained in more detail hereinafter, the junctions of a structure can be formed on the same surface of the semiconductor 11.

As will also be explained in more detail hereinafter, photon energy can be coupled into the electron gas 10 either directly or using via the superconductor contacts $14_1$, $14_2$.

Figure 4:
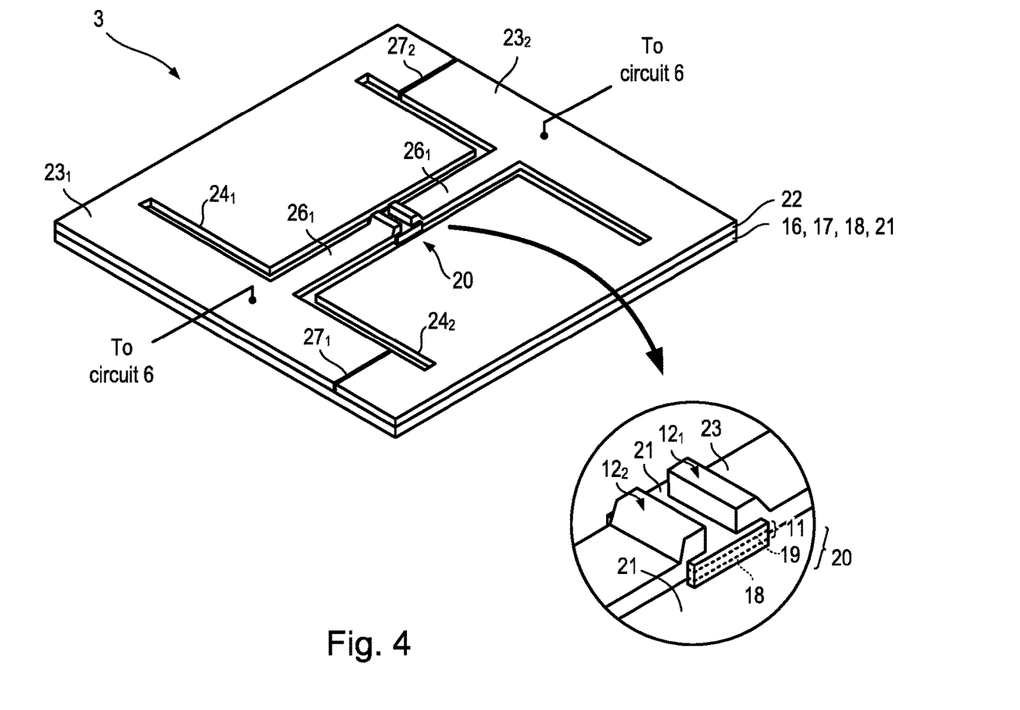
FIG. 4 is an isometric view of a bolometer.
Figure 5:
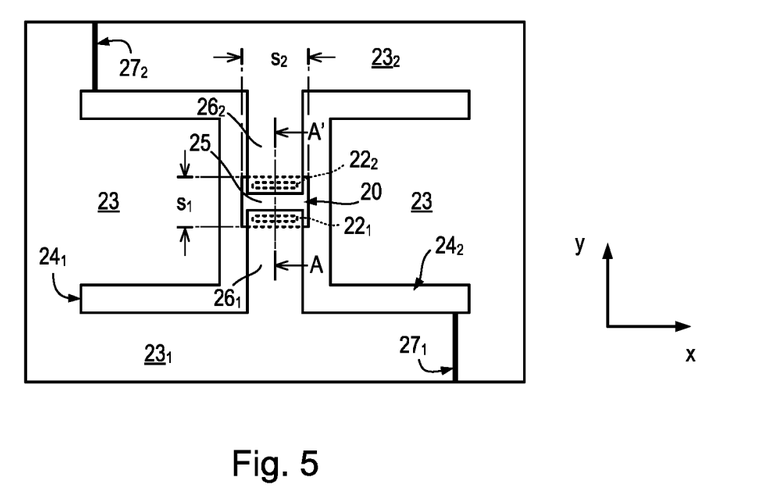
FIG. 5 is a plan view of the bolometer shown in FIG. 4.
Figure 6:
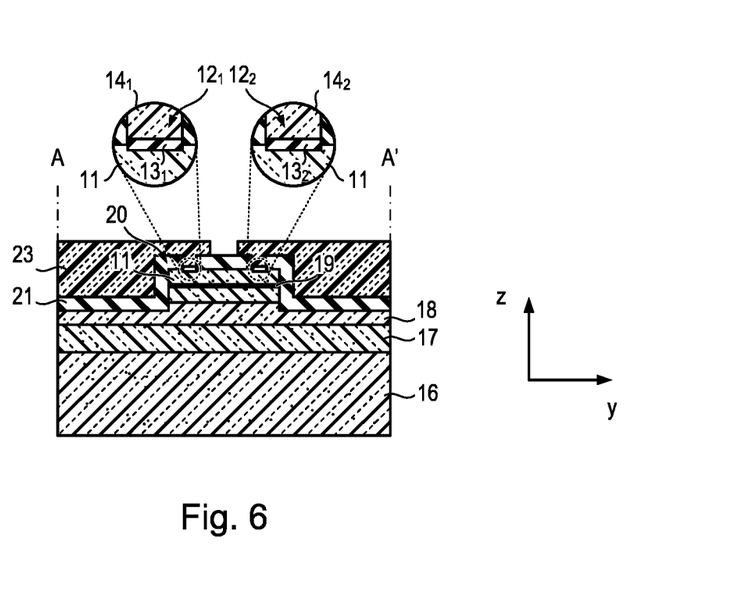
FIG. 6 is a cross section of the bolometer taken along the line A-A' in FIG. 5.

Referring to FIGS. 4, 5 and 6, a bolometer 3 employing a superconductor-insulator-semiconductor-insulator-superconductor (S-I-Sm-I-S) structure $9_2$ will now be described in more detail.

The bolometer 3 includes a substrate 16, a first buffer layer 17 overlying the substrate 16, a second, partially-etched buffer layer 18 overlying the first buffer layer 17 and a semiconductor region 11 supported on the second buffer layer 18. The semiconductor region 11 takes the form of a patterned layer (or "island") of strained silicon having an embedded delta-doped layer 19 which provides the two-dimensional electron gas 10 (FIG. 3). The silicon layer 11 has a germanium equivalent strain of about 10% (which is defined as the strain due to a relaxed silicon germanium alloy layer of 10% Ge content, and is equal to a lattice mismatch of about 0.42%). However, the silicon layer 11 can have a larger value of equivalent strain, for example, up to 75%. An unetched portion of the second buffer layer 18 and the strained silicon layer 11 generally form a mesa 20 (best shown in FIG. 6).

A thick dielectric layer 21 (herein also referred to as a "passivation layer") overlies the partially-etched portion of the second buffer layer 18 and the mesa 20. The thick dielectric layer 21 has first and second windows $22_1$, $22_2$ on top of the mesa 20 (best shown in FIG. 5) on opposite sides of the strained silicon layer 11. In the windows $14_1$, $14_2$ (best shown in FIG. 6), first and second thin dielectric layers $13_1$, $13_2$ are formed on the top of the strained silicon layer 11 in the windows $22_1$, $22_2$ in the thick dielectric layer 21. The first and/or second thin dielectric layers $13_1$, $13_2$ may be omitted.

In this example, a superconductor antenna 23 in the form of a superconductor twin-slot antenna overlies the dielectric layers 21, $13_1$, $13_2$. However, other antenna structures can be used. Furthermore, photon energy need not be coupled into the electron gas 10 using an antenna. Other forms of coupling can be used.

Referring in particular to FIG. 6, first and second regions of the antenna 23 provide first and second contacts $14_1$, $14_2$ to the silicon layer 11 via the first and second thin dielectric regions $13_1$, $13_2$ respectively. The strained silicon layer 11, the first dielectric regions $13_1$ and the first superconductor region $13_1$ form a first superconducting tunnel junction $12_1$. The strained silicon layer 11, the second dielectric regions $13_2$ and the second superconductor region $14_2$ form a second superconducting tunnel junction $12_2$.

The substrate 16 takes the form of single-crystal (001)-orientated silicon wafer or wafer die. However, the silicon wafer or wafer die can have other orientations. The first buffer layer 17 takes the form of a graded layer of silicon-germanium ($Si_{1-x}Ge_x$) in which germanium content, x, increases along the growth axis, z, and the second buffer layer 12 takes the form of a partially-etched layer of silicon-germanium ($Si_{1-x}Ge_x$) where germanium content, x, is at least 0.2. Germanium content, x, may be between about 0.2 and 0.5, preferably between 0.2 and 0.3. The strained silicon layer 11 has a thickness of about 30 nm and the delta-doped layer 19 takes the form of a layer of phosphorus having a full width at half maximum thickness no more than 3 nm and having an areal doping density of about $10^{13}$ $cm^{-2}$. The silicon layer 11 may have a thickness of between 10 and 100 nm. The delta-doped layer 19 is formed a few nanometers from the upper surface of the silicon layer 11. The thick dielectric layer 21 is formed of a layer of silicon dioxide ($SiO_2$) having a thickness of about 200 nm. The thin dielectric regions $13_1$, $13_2$ comprise silicon dioxide ($SiO_2$) and/or aluminium oxide ($Al_2O_3$) having a thickness less than 3 nm. The superconductor antenna 23 which also provides the superconducting contacts $13_1$, $13_2$, is formed from aluminium (Al).

As shown in FIGS. 4 and 5, the antenna 23 is patterned with a set of slots including first and second outwardly-facing 'C'-shaped slots $24_1$, $24_2$ and a cross-connecting slot 25 which defines first and second antenna lead portions $26_1$, $26_2$. The first and second contact regions $14_1$, $14_2$ are disposed close to the distal ends of the lead portions $26_1$, $26_2$. First and second narrow slots $27_1$, $27_2$ divide the antenna 23 into first and second portions $23_1$, $23_2$ which are isolated from each other at dc biases.

Referring in particular to FIG. 5, the silicon layer 11 can be rectangular in plan view having first and second side lengths, $s_1$, $s_2$. The sides may be equal, i.e. $s_1=s_2=s$. The side lengths may lie in a range between 10 nm and 10 μm, i.e. 10 nm≤$\{s_1, s_2\}$≤10 μm.

The output impedance of the bolometer 3 is about 50Ω.

Referring to FIGS. 7a to 7f and 8, a method of fabricating the bolometer 3 will now be described.

Figure 7:
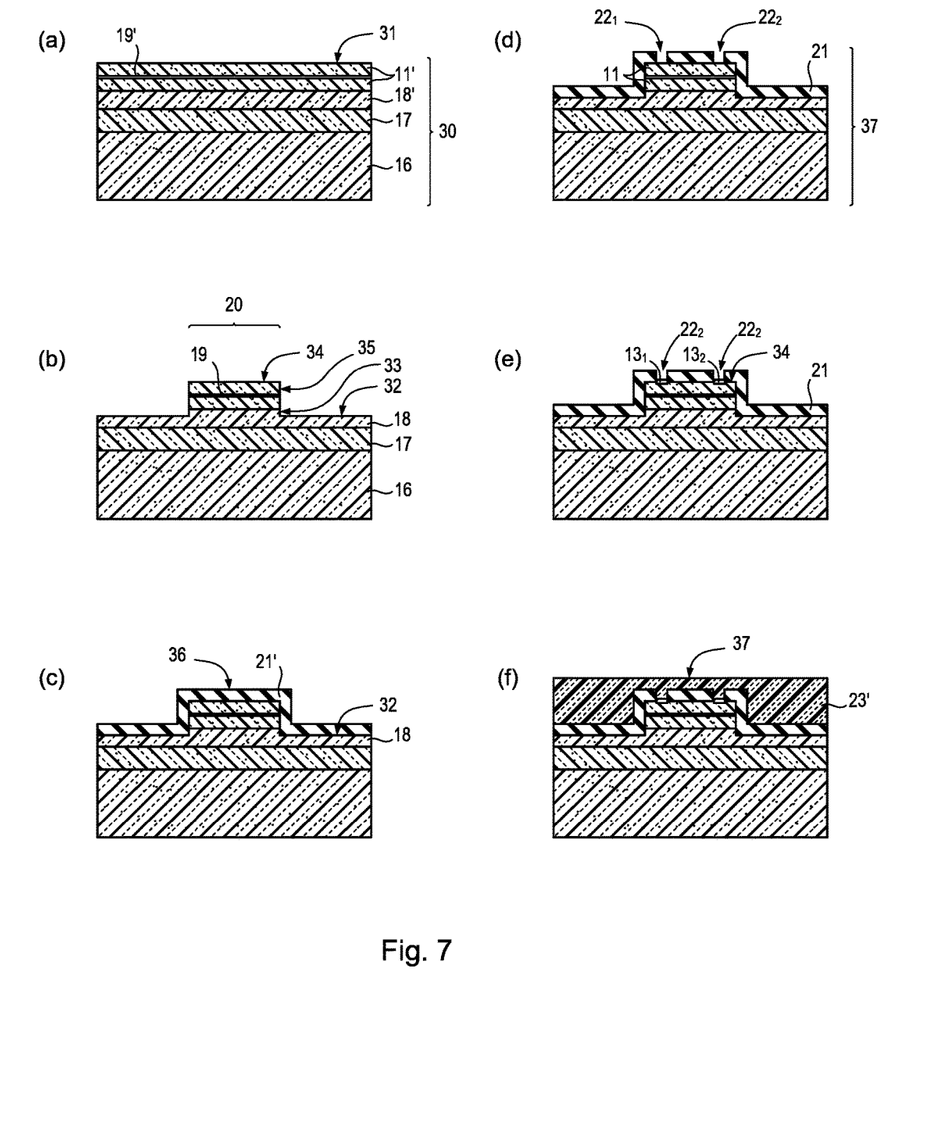
FIGS. 7a to 7f illustrate a bolometer at different stages during fabrication.
Figure 8:
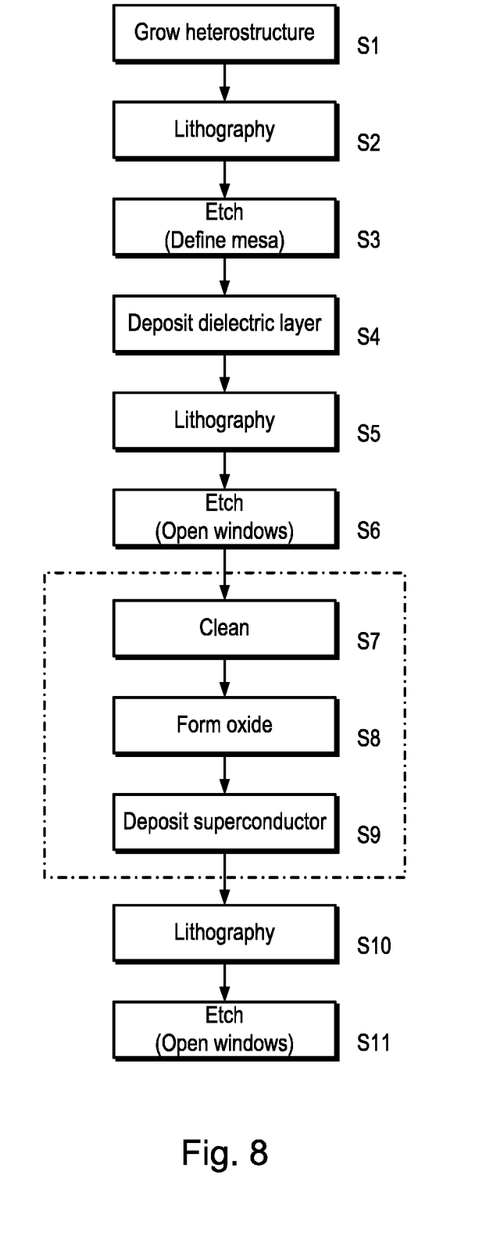
FIG. 8 is process flow diagram of a method of fabricating a bolometer.

Referring in particular to FIG. 7a, a heterostructure 30 is prepared by growing epitaxial semiconductors layers 17, 18', 11', 19' on the silicon substrate 16 using chemical vapour deposition or molecular beam epitaxy (step S1). The heterostructure 30 includes a graded layer 17 of silicon germanium alloy ($Si_{1-x}Ge_x$), a strain-relaxed buffer 18' of silicon germanium alloy ($Si_{1-x}Ge_x$) followed by a silicon layer if containing a thin, degenerately-doped layer 19' in the form of a delta-doped layer (which may also be referred to as a "delta layer").

A layer of photoresist (not shown) is applied to an upper surface 31 of the heterostructure 30, exposed and developed to provide a mask (not shown) (step S2). The mask (not shown) defines the area to be retained.

In unmasked areas (not shown), the strained silicon layer if and a portion of the underlying buffer layer 18' are removed using a dry plasma etching (step S3). In this example, a 10:1 mixture of carbon tetrafluoride ($CF_4$) and oxygen ($O_2$) is used for etching, at a pressure of 30 mTorr (4 Pa) and a power of 100 W.

Referring in particular to FIG. 7b, etching defines the mesa 20 which includes the strained silicon island 11 with a fixed volume of electron gas 10 in delta-doped layer 19 and leaves upper and side surfaces 32, 33 of a partially-etched silicon-germanium layer 18 and upper and side surfaces 34, 35 of the strained silicon layer 11.

Referring in particular to FIG. 7c, a conformal layer 21' of silicon dioxide (or "passivation layer") is deposited, for example, by chemical vapour deposition, to protect the upper and side surfaces 34, 35 of the strained silicon layer 11 (step S4). The passivation layer 21' allows contact windows $22_1$, $22_2$ to be defined and a dry plasma etch to be used when patterning a subsequently-deposited aluminium layer 23' (FIG. 7f) without damaging the underlying silicon.

A layer of photoresist (not shown) is applied to an upper surface 36 of the passivation layer 21', exposed and developed to provide a mask (not shown) (step S5). The mask (not shown) defines the area to be retained.

Unmasked areas (not shown) of the passivation layer 21' are removed using a wet etch (step S6). In this example, buffered hydrofluoric acid is used as an etchant.

Referring in particular to FIG. 7d, etching defines windows $22_1$, $22_2$ in the passivation layer 21.

Contacts are made to the island 11 by depositing and patterning an aluminium layer 23' (FIG. 5f). A process is used whereby the silicon surface is cleaned by heating to elevated temperatures and is then oxidised in a vacuum chamber (not shown) immediately prior to depositing the aluminium layer 23' (FIG. 7f).

Referring in particular to FIG. 7e, the work piece 37 is heated to 550° C. in a vacuum (step S7) and then thin layers $13_1$, $13_2$ of silicon dioxide are formed at the surface 34 of the silicon layer in the windows 22, $22_2$ in the passivation layer 21 by dry oxidation (step S8). However, the oxidation step may be omitted.

Referring in particular to FIG. 7f, a layer 23' of aluminium is deposited, for example by sputtering, over the thin oxide layers $13_1$, $13_2$ and the surface 36 of the passivation layer 21 (step S9).

A layer of photoresist (not shown) is applied to the upper surface 37 of the aluminium layer 23', exposed and developed (step S10). Unmasked areas (not shown) of the aluminium layer 23' are removed using a plasma etch (step S11).

The resulting structure is shown in FIG. 6.

Referring to FIGS. 1 to 6, the bolometer 3 which employs an electron gas 10 as an absorber can exhibit one or more advantages over bolometers which using a metal absorber.

First, electrons in silicon (or germanium) can have a much weaker thermal link to the lattice compared with electrons in a normal metal.

Secondly, using a thin doped layer, particularly a delta-doped layer, can result in a small volume of electrons having small thermal capacity.

Each of these can enhance sensitivity and responsivity.

Moreover, formation of thin dielectric layers, for example, layers of silicon dioxide, can enhance cooling power of the bolometer.

Experiments are conducted using a bolometer which is similar to that hereinbefore described but which has an unstrained, undoped silicon absorber and does not include thin, silicon dioxide layers. The antenna is designed to couple 150 GHz (0.15 THz) radiation to the absorber. Radiation at this frequency is generally considered to be low energy and places demands on a radiation detector.

Figure 9:
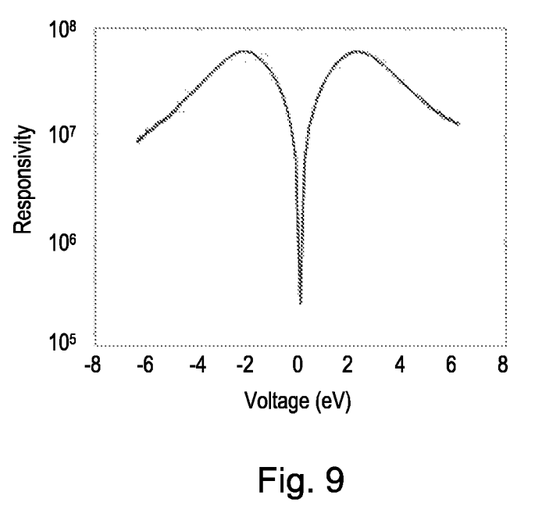
FIG. 9 is a plot of responsivity against voltage.
Figure 10:
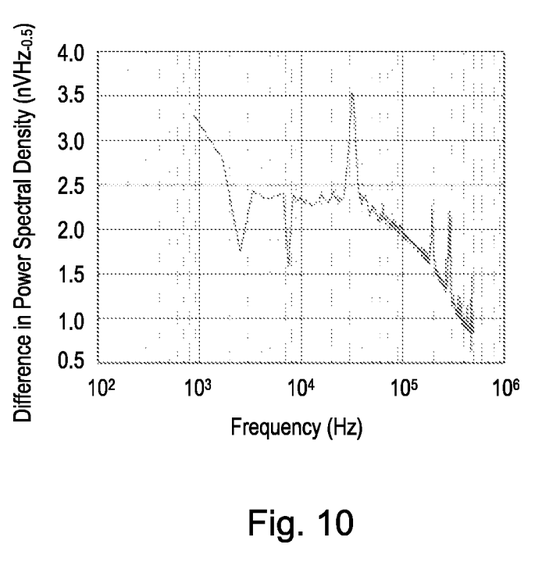
FIG. 10 is a plot of difference in power spectral density against frequency.
Figure 11:
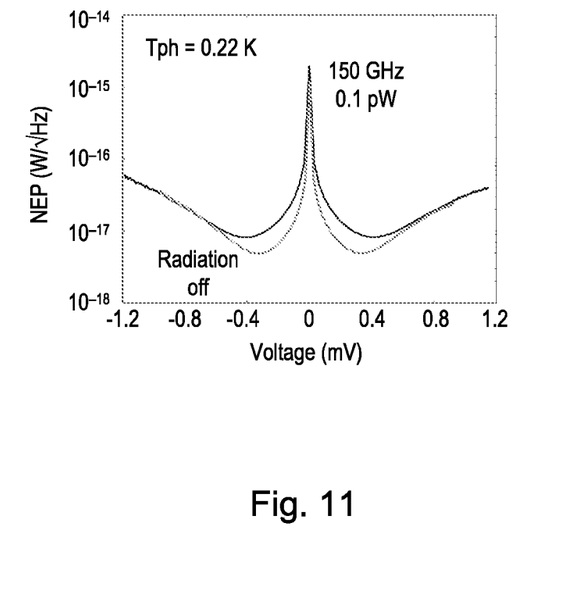
FIG. 11 is a plot of noise equivalent power against voltage.

Results for the bolometer at 220 mK, in the current bias mode, are shown in FIGS. 9, 10 and 11. The results are taken for the bolometer operating in hot-electron mode.

Referring in particular to FIG. 9, the bolometer exhibits peak responsivity of order $10^8$ $VW^{-1}$ (corresponding to maximum e-cooling)

Referring in particular to FIG. 10, the bolometer exhibits a response time of less than 1.5 μsec.

Finally, referring to FIG. 11, the bolometer exhibits a (dark) noise equivalent power (NEP) of $5 \times 10^{-18}$ $WHz^{-0.5}$.

These results compare favourably with existing metal-based bolometers. The bolometer 3 illustrated in FIGS. 1 to 6 is expected to exhibit even better characteristics due to the strained silicon layer, the thin doped layer (particularly a delta-doped layer) and the semiconductor-insulator-superconductor tunnel junction.

As mentioned earlier, strain can be used to lift valley degeneracy. Additionally or alternatively, quantum confinement can be used lift valley degeneracy.

Figure 12:
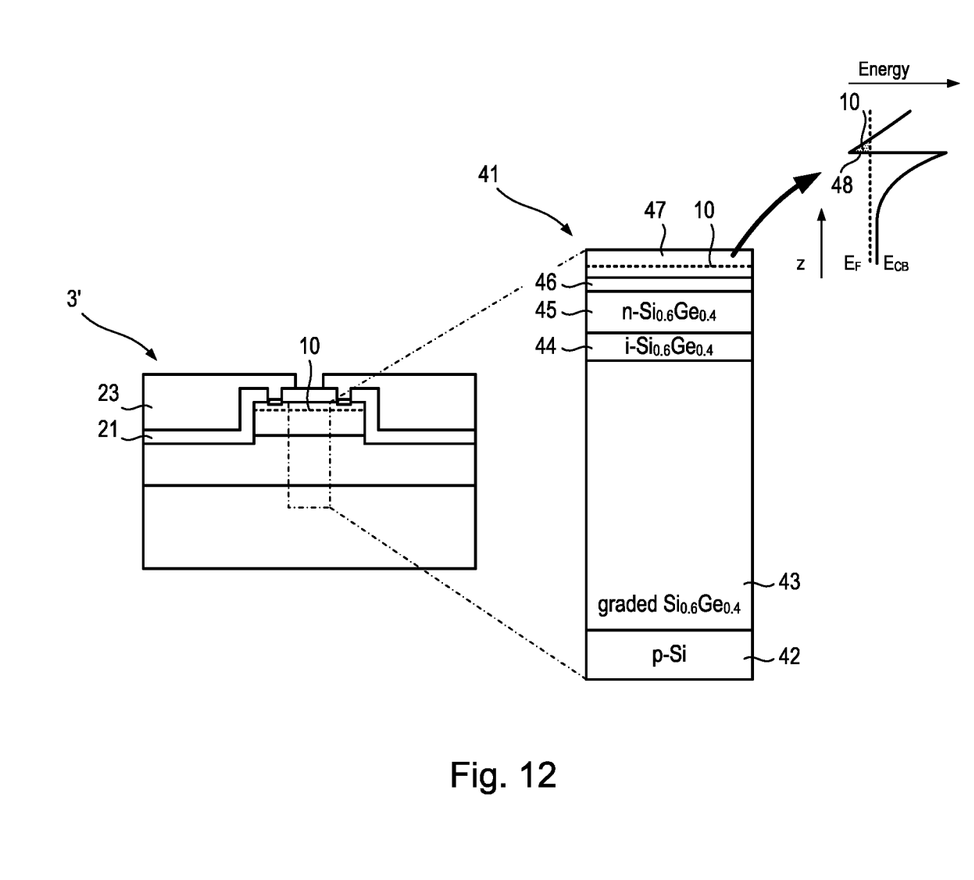
FIG. 12 illustrates another bolometer.

Referring to FIG. 12, a bolometer 3' is shown which is similar to that described with reference to FIGS. 3, 4 and 5, but which differs in that it employs an inverted modulation doping heterostructure 41 to form a two-dimensional electron gas 10.

The heterostructure 41 includes p-type silicon substrate 42 and (in order from the substrate 42) a 1 μm-thick, undoped ($N_D=1 \times 10^{16}$ $cm^{-3}$) graded layer 43 of silicon-germanium alloy having germanium content which increases from 0 to 0.4, a 10 nm-thick undoped layer 44 of silicon-germanium alloy having a germanium content of 0.4, a 50 nm-thick layer 45 of doped ($N_D=6 \times 10^{18}$ $cm^{-3}$) silicon-germanium alloy having a germanium content of 0.4, a 3 nm-thick undoped layer 46 of silicon-germanium alloy having a germanium content of 0.4 and a 5 nm-thick layer 47 of undoped ($N_D=1 \times 10^{16}$ $cm^{-3}$) silicon. This results in the conduction band edge, $E_{CB}$, forming a 'V'-shaped potential 48 in the silicon layer 47 in which a two-dimensional electron gas 10 forms close to the Fermi energy, $E_F$, and which has a sheet carrier concentration of about $1 \times 10^{11}$ $cm^{-2}$.

In the examples given earlier, an antenna structure is used to couple photon energy into the electron gas 10. However, photon energy can be coupled directly into the electron gas 10.

Figure 13:
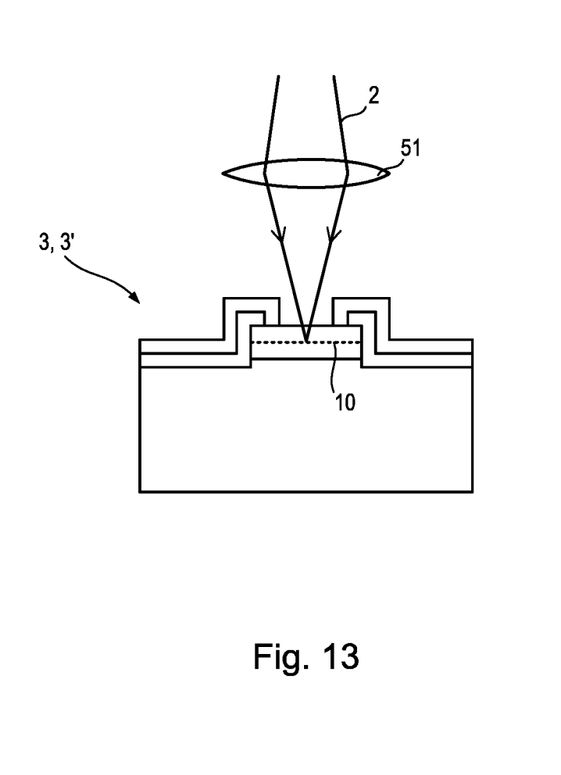
FIG. 13 illustrates a bolometer which employs a lens.

Referring to FIG. 13, the bolometer 3 may be provided, for example, with a lens 51 which is arranged to focus incident radiation 2 onto the electron gas 10. The antenna structure can be omitted, although superconducting contacts $14_1$, $14_2$ are still used.

Figure 14:
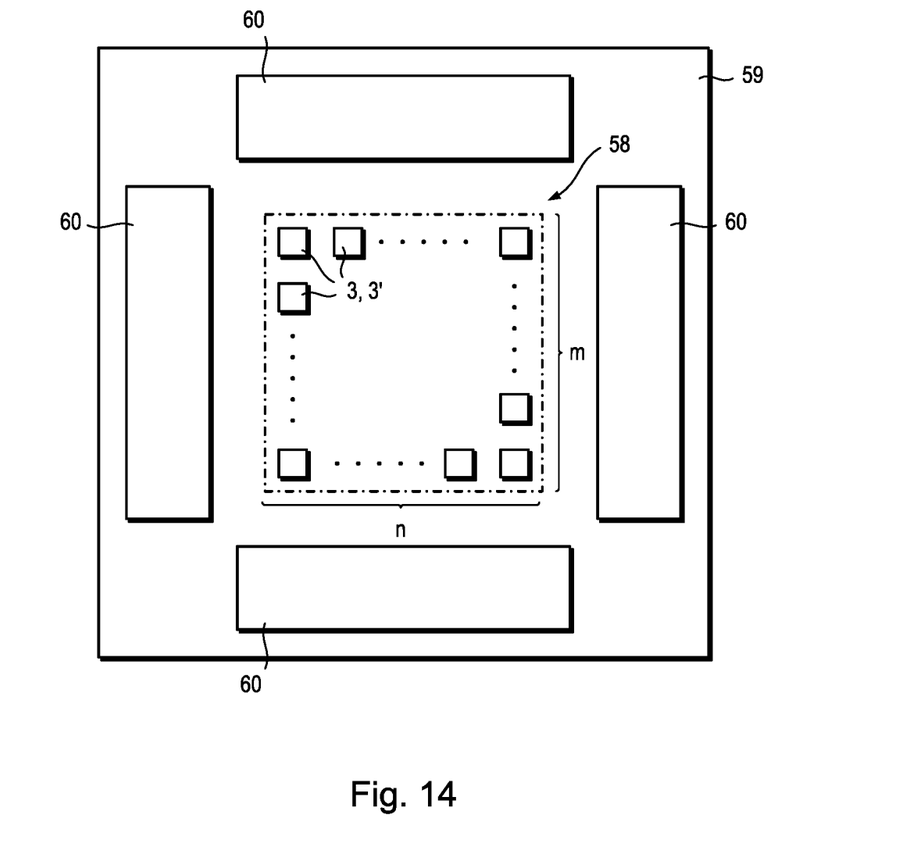
FIG. 14 schematically illustrates apparatus comprising an array of bolometers.

Referring to FIG. 14, an (n×m) array 58 of bolometers 3, 3' is shown.

The array 58 can be formed on a common substrate 59 (i.e. silicon substrate) and can include processing circuitry 60 row and column decoders for addressing each bolometer 3, 3' separately, amplifiers and processors. The array 58 may include 1000×1000 or more bolometers 3.

An aluminium-based bolometer 3 can be operated at different phonon temperatures depending on the required performance for a specific application. A 300 mK phonon temperature can be obtained using a closed-cycle turn-key $^4$He/$^3$He system and using the S-I-Sm tunnel junction to cool the absorber further, for example, to 30 mK.

A vanadium-based bolometer 3 can be cooled using a simpler 1 K platform and using S-I-Sm tunnel junction to cool the absorber further, for example, to 300 mK or even lower.

The bolometer 3 and bolometer array 58 can be used in a variety of different applications including astronomical detection, biomedical imaging, security screening, remote sensing and quantum information processing.

It will be appreciated that many modifications may be made to the embodiments hereinbefore described.

The dielectric layer may be omitted. Thus, the insulator may take the form of a region of non-degenerately-doped semiconductor, for example undoped or low-doped semiconductor which is depleted, interposed between the superconductor and the degenerately-doped semiconductor, e.g. the delta-doped layer.

If strained silicon is used, silicon may have a value of equivalent strain of between 10% and 75%.

A strained layer of silicon need not be used as the semiconductor. Instead, a strained layer of germanium (Ge) or silicon-germanium alloy can be used.

The electron gas need not be a two-dimensional electron gas a thin, three-dimensional electron gas may be used. Other thin, highly-doped doping profiles may be used.

Aluminium need not be used as the superconductor. Instead, other superconducting materials can be used such as, for example, tin (Sn), niobium (Nb), vanadium (V) or tantalum (Ta).

Silicon dioxide need not be used as the thin dielectric layer.

The layers can have thicknesses other than those specified. Suitable thicknesses can be found by routine experiment.

The invention claimed is:

1. A bolometer comprising a superconductor-insulator-semiconductor-superconductor structure or a superconductor-insulator-semiconductor-insulator-superconductor structure, wherein the semiconductor comprises an electron gas in a layer of silicon, germanium or silicon-germanium alloy in which valley degeneracy is at least partially lifted.

2. A bolometer according to claim 1, wherein the layer of silicon, germanium or silicon-germanium is strained.

3. A bolometer according to claim 1, wherein the silicon, germanium or silicon-germanium layer comprises a layer of n-type silicon, germanium or silicon-germanium.

4. A bolometer according to claim 3, wherein the silicon, germanium or silicon-germanium layer is doped to a concentration of at least $1 \times 10^{19}$ cm$^{-3}$.

5. A bolometer according to claim 1, wherein the silicon, germanium or silicon-germanium layer has a thickness of no more than 100 nm.

6. A bolometer according to claim 1, wherein the silicon, germanium or silicon-germanium layer includes a delta-doped layer.

7. A bolometer according to claim 1, wherein the silicon, germanium or silicon-germanium layer includes a quantum well.

8. A bolometer according to claim 1, wherein the insulator or a one of or both insulators comprises a layer of dielectric material.

9. A bolometer according to claim 8, wherein the dielectric material comprises an oxide.

10. A bolometer according to claim 8, wherein the dielectric material comprises silicon dioxide.

11. A bolometer according to claim 8, wherein the dielectric material comprises an oxide of the superconductor.

12. A bolometer according to claim 8, wherein the layer of dielectric material has a thickness less than 5 nm.

13. A bolometer according to claim 1, wherein the insulator or a one of or both insulators comprises a layer of non-degenerately-doped semiconductor.

14. A bolometer according to claim 1, wherein the superconductor comprises aluminium.

15. Apparatus comprising:
a bolometer according to claim 1;
circuitry arranged to measure the bolometer comprising:
a voltage and/or current bias source; and
a sensor for measuring for current through the bolometer and/or for measuring a voltage across the bolometer.

16. Apparatus according to claim 15, further comprising:
a cryogenic system configured to cool the bolometer to a temperature no more than 4.2 K.

17. Apparatus according to claim 16, wherein the circuitry is arranged for single photon measurement.

18. Apparatus according to claim 15, wherein the circuitry is arranged for integrating measurement.

19. Apparatus comprising:
an array of bolometers according to claim 1 supported on a common substrate.

20. An astronomical detection and imaging system comprising a bolometer according to claim 1.

21. A biomedical detection and imaging system comprising a bolometer according to claim 1.

22. A security screening system comprising a bolometer according to claim 1.

23. A remote sensing system comprising a bolometer according to claim 1.

24. A quantum information processing system comprising a bolometer according to claim 1.

* * * * *